US010826472B2

(12) United States Patent
Harrer

(10) Patent No.: US 10,826,472 B2
(45) Date of Patent: Nov. 3, 2020

(54) DIGITAL INPUT CIRCUIT FOR RECEIVING DIGITAL INPUT SIGNALS OF A SIGNAL GENERATOR

(71) Applicant: Pilz GmbH & Co. KG, Ostfildern (DE)

(72) Inventor: Bernd Harrer, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 0 days.

(21) Appl. No.: 16/230,138

(22) Filed: Dec. 21, 2018

(65) Prior Publication Data

US 2019/0199331 A1   Jun. 27, 2019

(30) Foreign Application Priority Data

Dec. 22, 2017 (DE) .......................... 10 2017 131 200

(51) Int. Cl.
*H03K 5/08* (2006.01)
*H03K 17/30* (2006.01)
*H03K 17/795* (2006.01)

(52) U.S. Cl.
CPC ............... *H03K 5/08* (2013.01); *H03K 17/30* (2013.01); *H03K 17/7955* (2013.01)

(58) Field of Classification Search
CPC ....... H03K 5/08; H03K 17/30; H03K 17/7955
See application file for complete search history.

(56) References Cited

U.S. PATENT DOCUMENTS

| 5,111,070 | A | | 5/1992 | Murphy et al. |
| 5,304,918 | A | * | 4/1994 | Khieu ..................... G05F 1/567 |
| | | | | 323/315 |
| 6,043,703 | A | | 3/2000 | Bavol |

FOREIGN PATENT DOCUMENTS

| EP | 1261120 A1 | * | 11/2002 | ............ H02M 3/155 |
| EP | 1261120 A1 | | 11/2002 | |
| EP | 2506436 A2 | | 10/2012 | |
| EP | 2637304 A1 | | 9/2013 | |

OTHER PUBLICATIONS

Search Report in Corresponding European Patent Application No. 18211557.6, dated May 23, 2019, with English translation.

* cited by examiner

*Primary Examiner* — Jung Kim
(74) *Attorney, Agent, or Firm* — Edell, Shapiro & Finnan, LLC

(57) ABSTRACT

A digital input circuit adopts a first state when an input signal is below a lower threshold value and adopts a second state when the input signal is above an upper threshold value. The digital input circuit comprises first and second subcircuits that exhibit a non-ideal current output behavior at least in the second state, and each comprises a current stabilizing element with a driving circuit and a voltage stabilizing element. The first and second subcircuits are configured such that, at least in a portion of the second state, an electric current flowing through the first subcircuit's voltage stabilizing element consists substantially of a stabilized current of the second subcircuit, and an electric current that flows through the second subcircuit's voltage stabilizing element consists substantially of a stabilized current of the first subcircuit, such that the non-ideal current output behavior of the first and second subcircuits compensate for each other.

10 Claims, 2 Drawing Sheets

DIGITAL INPUT CIRCUIT FOR RECEIVING DIGITAL INPUT SIGNALS OF A SIGNAL GENERATOR

CROSS REFERENCE TO RELATED APPLICATIONS

This application claims foreign priority under 35 U.S.C. § 119(a)-(d) to Application No. DE 102017131200.5 filed on Dec. 22, 2017, the entire contents of which are hereby incorporated by reference.

TECHNICAL FIELD

The present invention relates to a digital input circuit for receiving digital input signals of a signal generator, the digital input circuit comprising an input, through which the input signal can be fed to the input circuit, wherein the input circuit adopts a first state, when the input signal reaches or drops below a lower threshold value, and wherein the input circuit adopts a second state, when the input signal reaches or exceeds an upper threshold value; a first subcircuit that comprises at least one current stabilizing element with a driving circuit and at least one voltage stabilizing element, wherein the first subcircuit exhibits a non-ideal current output behavior at least in the second state, as well as a second subcircuit that comprises at least one current stabilizing element with a driving circuit and at least one voltage stabilizing element, wherein the second subcircuit exhibits a non-ideal current output behavior at least in the second state.

BACKGROUND

A trend that can be observed in technology at the present time is a continually progressive miniaturization of devices and device components, in particular, also electric and electronic devices and device components. This trend towards miniaturization often goes hand in hand with a simultaneous broadening of the range of functions of devices or, more specifically, device components. For example, in the case of switching apparatuses or in the case of safety switching apparatuses, which are provided for safety-oriented applications, in particular, in automatically operating technical systems, this trend has resulted in an increase in the number of inputs for receiving analog or digital input signals of various signal generators. These analog or digital input signals come, for example, from sensor units or event signaling devices, such as, for example, emergency OFF buttons, emergency STOP bottoms, safety doors, safety shutdown mats, two hand switches, end position switches and other position switches.

Digital input signals are binary signals and are characterized by two defined states that can be defined, for example, by two static potentials. These binary states are characterized by various voltage states, wherein a first state is adopted when a defined voltage threshold value is reached or undershot. In this case it concerns a so-called low level state. A second state is adopted when a defined voltage threshold value is reached or exceeded. In this case it concerns a so-called high level state.

Digital input circuits of the type mentioned in the introductory part of the specification for receiving digital input signals of a signal generator with at least one input are known from the prior art in a very wide range of embodiments. In the case of current drawing digital input circuits, which are typically operated with an operating voltage of 24 V (DC), a distinction is made, according to the standard EN 61131-2:2007, between three different types (type 1, type 2 and type 3). These three types of digital input circuits differ, in particular, in their high levels, their low levels and in their current consumption.

Type 1 digital input circuits must necessarily detect a high level no later than at an input voltage of 15 V. Therefore, in practice this high level is already detected at an input voltage of <15 V. Furthermore, the type 1 digital input circuits have to detect a high level over an entire input voltage range of 15 V to 30 V. The current consumption is in the high level region of ≥2 mA and can be up to 15 mA. Furthermore, digital input circuits of the type 1 (as well as of the types 2 and 3 mentioned further below) have to be capable of detecting a low level over an entire range of −3 V to 5 V. Therefore, in practice a low level is already detected at input voltages of >5 V. In the range of −3 V to 5 V the input current may be between 0 mA and 15 mA. A current limit of 0.5 mA is relevant when the input voltage is between 5 V and 15 V. In this range the input must also detect a low level, in so far as the input current is <0.5 mA. Such type 1 digital input circuits are used, in particular, for electromechanical switching apparatuses, such as, for example, push buttons or relay contacts or also for 3 conductor sensor units. Emergency OFF switching apparatuses are a typical example of an application for type 1 digital input circuits.

Digital input circuits of the type 2 are suitable, for example, for 2 conductor sensor units and for semiconductor sensors that require a relatively high quiescent current to operate them. The current consumption in the high level region, which is between 11 V and 30 V, is typically ≥6 mA and can be up to 30 mA.

Digital input circuits of the type 3 are characterized, in particular, in the case of high electrical voltages, by a lower power consumption and less waste heat as compared to the type 2 digital input circuits, so that more digital input circuits can be combined to form a digital input module than is the case with type 2 digital input circuits. Type 3 digital input circuits have to detect a high level in the input voltage range between 11 V and 30 V. The current consumption is in the high level region, which is between 12 V and 30 V, typically ≥2 mA and can be up to 15 mA. In the input voltage range between −3 V and 5 V type 3 digital input circuits have to detect a low level at an allowable current consumption between 0 mA and 15 mA. In addition, a low level has to be detected when the input voltage is between 5 V and 11 V; and the input current is ≤1.5 mA.

The aforementioned trend towards miniaturization in conjunction with an increase in functions at the same time demands not only the use of increasingly smaller components, but also a continuous reduction in the power loss of the components that are installed and the circuits that are used. This also applies, in particular, to digital input circuits that are needed, for example, to process sensor signals or signals from event signaling devices. Therefore, in the case of the input voltages, which correspond to the second state (thus, the logic high level), the goal of such digital input circuits must be to keep the input current as low as possible. This is especially important in the region of the highest occurring input voltages, since then usually the largest currents flow and consequently the largest power losses also occur. At the same time, however, there are often also demands for a minimal input current, which on reaching the upper threshold value, which defines the beginning of the high level region, may not be undershot.

A digital input circuit that is optimal with respect to its minimal power loss consumption exhibits a shape of its input current/input voltage characteristic as shown in FIG. 1.

This figure shows the curve of the input current $I_{IN}$ of the digital input circuit as a function of the input voltage $U_{IN}$. The low level region is defined by an input voltage $U_{IN} \leq U_{Low, max}$ as well as by an input current $I_{IN} \leq I_{Low, max}$. The high level region is defined by an input voltage $U_{High, min} \leq U_{IN} \leq U_{High, max}$ and by an input current $I_{IN} = I_{High, min}$. Between the low level region and the high level region there is a transition region between the input voltage $U_{IN} > U_{Low, max}$ as well as $U_{IN} < U_{High, min}$, in which an input current $I_{Low, max} < I_{IN} < I_{High, min}$ flows. As already stated above, in the practical application the high level state and the low level state are already detected at input voltages that are inside the transition region. An essential feature of this idealized characteristic curve is the constant input current $I_{IN} = I_{High, min}$ in the high level region of the digital input circuit. Thus, in the ideal case, the input current $I_{IN}$ in the high level region does not continue to increase despite the rising input voltage $U_{IN}$.

In contrast, FIG. 2 shows the shape of the input current/input voltage characteristic of an actual digital input circuit, which exhibits a non-optimal power loss consumption, since in the second state (high level region) a non-ideal current consumption behavior is present. Plotted is in turn the curve of the input current $I_{IN}$ of the digital input circuit as a function of the input voltage $U_{IN}$. The characteristic curve, as shown in FIG. 2, differs from the idealized characteristic curve, shown in FIG. 1, essentially due to the fact that the input current $I_{IN}$ continues to rise (more or less intensively) even in the high level region. Thus, as the input voltage $U_{IN}$ becomes larger and larger, it holds that: $I_{IN} > I_{High, min}$. The resulting rise $\Delta I$ of the electrical input current $I_{IN}$ leads with increasing input voltage $U_{IN}$ to a considerably greater increase in the electrical power loss than is the case with a characteristic curve of an ideal digital input circuit, as shown in FIG. 1.

In the prior art a circuit arrangement, as shown in FIG. 3, is used, for example, to stabilize the input current of a digital input circuit. The circuit arrangement of the digital input circuit 100' comprises a very simply designed voltage regulator that comprises a bipolar transistor (NPN transistor) T1', a Zener diode Z1' and a series resistor R2' for the Zener diode Z1'. A voltage limitation can be achieved by the Zener diode Z1'. In order for the output voltage of a voltage regulator, which is constructed in such a manner, to exhibit good stabilization, it is necessary for the Zener diode Z1' to be operated in its stabilization region (i.e., with a small differential resistance) or at least close to it. For this purpose, however, the series resistor R2' of the Zener diode Z1' of the voltage regulator has to be selected sufficiently small. However, as the input voltage increases ($U_{IN} > U_{High, min}$), this aspect has the drawback that the current through the series resistor R2' and the Zener diode Z1' and, associated therewith, also the input current of the digital input circuit 100' itself continue to increase significantly. Thus, the current rise $\Delta I$ in the high level region cannot be kept very small by any means. Consequently in order for the voltage regulator to achieve good stabilization of the output voltage, a feature that is desirable per se, when the input voltage increases, the need for the voltage regulator to have its own current becomes increasingly more important.

If, however, on the other hand, the series resistor R2' is increased, then the stability of the output voltage of the voltage regulator deteriorates in proportion to the increase in the series resistor R2'. The working point of the Zener diode Z1' that is used to stabilize the output voltage can move very rapidly into the blocking range of the Zener diode Z1'. In this range the differential resistance of the Zener diode Z1' is very large, as well-known. This has the drawback that the actual output voltage of the voltage regulator depends not only relatively highly on the input voltage $U_{IN}$, but also highly on the sample of the Zener diode Z1' that is used. This in turn can result in the output voltage of the voltage regulator not reaching the minimum value, required to detect a high level state, at least at an input voltage $U_{IN} = U_{High, min}$. Thus, the digital input circuit detects a high level state only at input voltages $U_{IN} > U_{High, min}$ or in the extreme case not even then.

In addition to the lack of reliability of an input circuit 100' that is configured in such a way, the increase in the input current $I_{IN}$ as the input voltage $U_{IN}$ rises despite a relatively large series resistor R2' of the Zener diode Z1' is often impossible to ignore. This increase in the input current $I_{IN}$ as the input voltage $U_{IN}$ rises should be noted, in particular, when a plurality of digital input circuits for forming a digital input module have to be housed in a single housing with a limited power dissipation capacity.

In other digital input circuits known from the prior art, a stabilization of the input current is achieved by a single current source. The above described drawbacks of the circuit arrangement (i.e., the current rise $\Delta I$ in the high level region, as shown in FIG. 2, and a lack of reliability) also occur when typical real current sources are used. One example of such an embodiment is known from EP 1 906 533 A1, where an additional current source for setting a quiescent current in the low level region is used to connect proximity switches.

In order to obtain a digital input circuit with an electrical power loss that is as low as possible, the digital input circuit should exhibit ideally a progression of its input current/input voltage characteristic in the logic high level region that comes as close as possible to the characteristic curve shown in FIG. 1. Thus, it is essentially about minimizing as much as possible the increase in the input current $\Delta I$, illustrated in the input current/input voltage characteristic according to FIG. 2, when the input voltage $U_{IN} > U_{High, min}$ increases. In addition, the minimum input current $I_{IN}$ in the high level region should be as close as possible to the minimum required input current $I_{High, min}$. Another objective is to implement the digital input circuit in a way that is as simple as possible and, as a result, also inexpensive.

SUMMARY

Thus, the object of the present invention is to provide a digital input circuit of the type that is mentioned in the introduction and that allows a reliable detection of high level and low level states of the input signal as well as a particularly low loss operation in the high level region and at the same time is designed in a simple and inexpensive manner.

The solution to this problem delivers a digital input circuit of the type that is mentioned in the introduction and exhibits the features disclosed in the characterizing part of claim 1. The dependent claims relate to advantageous further developments of the invention.

A digital input circuit of the present invention is characterized in that the first subcircuit and the second subcircuit are designed in such a way and are connected to one another such that at least in the second state or at least in a portion of the second state an electric current, which flows through the voltage stabilizing element of the first subcircuit, consists substantially of a stabilized current of the second subcircuit, and an electric current, which flows through the voltage stabilizing element of the second subcircuit, consists substantially of a stabilized current of the first subcircuit, so that the non-ideal current output behavior of the first subcircuit and the non-ideal current output behavior of the second subcircuit largely compensate for each other at least in the second state. Thus, the circuit architecture of the digital input circuit of the present invention is characterized by the use of at least two subcircuits, which form current sources, wherein these subcircuits are connected in series preferably crosswise such that at least for input signals in the high level region (or at least in a portion of the high level region), which defines the second state of the digital input circuit, the electric current, which flows through the voltage stabilizing element of the first subcircuit, consists substantially of the stabilized current of the second subcircuit; and the electric current, which flows through the voltage stabilizing element of the second subcircuit, consists substantially of a stabilized current of the first subcircuit. As a result, it is achieved that two parallel constant or substantially constant currents flow in the area of the first and second subcircuit. With this circuit architecture it is possible to fulfill in a surprisingly simple and cost effective manner the objective of a digital input circuit exhibiting an input current/input voltage characteristic that almost exhibits the optimal curve, according to FIG. 1, in the region of the second state, which is formed by the high level region. The currents of the two driving circuits make up only a small portion of the currents of the two subcircuits in the second state (high level region). The current rise $\Delta I$, according to FIG. 2, edges downwards to zero even at input voltages $U_{IN} > U_{High,\ min}$, so that the electrical power loss in the second state of the digital circuit arrangement of the invention can be minimized in an advantageous manner. The digital input circuit of the invention is suitable, in particular, even for digital input modules, which comprise a plurality of digital input circuits, which are housed in a single housing with a limited power dissipation capacity.

In a preferred embodiment it is proposed that the voltage stabilizing elements of the first and the second subcircuit be Zener diodes that are operated in their stabilization region in the second state. The circuit architecture makes it possible to select the dimensions of the Zener diodes in a very simple way when Zener diodes are used for the first subcircuit and for the second subcircuit, so that at least for the input signals in the high level region an adequately large current flows through both Zener diodes in order to be able to operate them in their stabilization region or at least close to it. The good mutual stabilization of the currents of both subcircuits (and, thus, the entire input current) in this circuit architecture is based on the fact that the currents of the Zener diodes and consequently also the voltages of the Zener diodes are kept stable. The mutual stabilization of the currents of the two subcircuits is the greatest, when the Zener diodes are in their stabilization region. This aspect is achieved in an advantageous way without any disadvantageous, notable increase in the input current $I_{IN}$ in the high level region, which would be the case with the digital input circuit 100', according to FIG. 3, and an operation of the Zener diode Z1' of the voltage regulator, provided therein, in the stabilization region.

As an alternative to Zener diodes, other voltage stabilizing elements, such as, for example, conventional diodes, light emitting diodes or reference diodes (one diode or a plurality of diodes that are connected in series or also in series with, for example, one or more Zener diodes), are also possible as a rule. Even with conventional diodes it is possible to limit the current rise $\Delta I$, according to FIG. 2, almost as well as with Zener diodes, since the differential resistance of diodes in the conducting state region can have values similar to those of many a Zener diode in the stabilization region upon reaching the break-down voltage. Only the scattering of the diode voltage at a certain current is as a rule larger than in the case of Zener diodes. The result is that the scattering of the absolute current of the subcircuits, in which Zener diodes are used as voltage stabilizing elements, is usually smaller.

In a particularly preferred embodiment there is the option that the digital input circuit comprises a high valued resistor, by which the first subcircuit is connected to ground and the resistance value of the high valued resistor is preferably $\geq 750$ k ohms, in particular, $\geq 1$ mega ohm. It has been shown that another advantage of operating the Zener diodes of the first subcircuit and the second subcircuit in their stabilization region is the fact that, as a result, their influence on the component dependent tolerance of the currents of the first subcircuit and the second subcircuit is also the lowest. Thus, the current rise $\Delta I$ is minimal, when the Zener diodes of the two subcircuits are operated in their respective stabilization region, and the resistor is as large as possible, as in this embodiment, for example, $\geq 1$ mega ohm. This high valued resistor has to ensure, in particular, the function that when the input voltage $U_{IN}$ increases (starting from 0 V), a current is able to flow at all into the input. Thus, this resistor is used to some extent as an "initial resistor" or, more specifically, a "starting resistor". Specifically this resistor enables in the "power-up phase" that a current can flow in the driving circuit of the current stabilizing element of the first subcircuit. This current in turn is a prerequisite for the first subcircuit to be able to supply a current. This current is the prerequisite for a current flow in the driving circuit of the current stabilizing element of the second subcircuit that ultimately enables a current flow into the second subcircuit.

In a particularly preferred embodiment it can be provided that the current stabilizing element of the first subcircuit is formed by a bipolar transistor, in particular, by a PNP transistor, with a base, an emitter and a collector. As a result, the current stabilizing element of the first subcircuit can be implemented in a relatively simple and cost effective way.

Preferably the current stabilizing element of the second subcircuit can be formed by a bipolar transistor, in particular, by an NPN transistor, with a base, an emitter and a collector. Because of this measure, the current stabilizing element of the second subcircuit can also be implemented in a relatively simple and cost effective way.

In one advantageous embodiment it is proposed that the two subcircuits be connected to one another such that the base of the bipolar transistor of the first subcircuit is connected to the collector of the bipolar transistor of the second subcircuit.

In an additional advantageous embodiment the two subcircuits can be connected to one another such that the base of the bipolar transistor of the second subcircuit is connected to the collector of the bipolar transistor of the first subcircuit.

In a preferred embodiment it can be provided that the digital input circuit comprises a third subcircuit that is configured to detect the logic state of the digital input circuit and that is connected to an output, through which an output signal can be emitted. In another embodiment it is also possible to house this third subcircuit offset in a separate device unit. However, this third subcircuit is not absolutely necessary. Thus, the digital input circuit can be used, for example, to display visually the logic states of the input signal. This display can be integrated, in particular, into the second subcircuit by replacing for this purpose the Zener diode, for example, with an LED or with an LED that is connected in series to a Zener diode or in series to a conventional diode.

In a particularly preferred embodiment there is the option that the third subcircuit comprises a coupling element, which is configured to couple the input to the output, and a threshold value element that is connected in parallel to the coupling element, wherein the threshold value element is designed to make a switching threshold available to the coupling element, and is designed, in particular, as a resistor. With the aid of the coupling element and the threshold value element, it can be checked whether the digital input circuit is in the first state (in the low level region) or in the second state (in the high level region). Preferably the coupling element can be designed such that it is conductive and couples the input to the output only if the digital input circuit is in the second state (in the high level region). The coupling element can be designed, in particular, as an optocoupler, in order to cause a galvanic separation of a primary side of the digital input circuit, which comprises the input, from a secondary side, which comprises the output. This galvanic separation has the advantage that in the event of an overvoltage the output or, more specifically, the components connected to the output can be protected against damages as well as the resulting faults. In this case the threshold value element, which is designed preferably as a resistor, provides, on the one hand, the necessary switching threshold of the coupling element and, on the other hand, also limits in the high level region the current through the light emitting diode of the optocoupler, which forms preferably the coupling element, to the value, for which the optocoupler is specified (for example, 1 mA). Finally the current flow through the resistor also serves the purpose that at an input current $I_{IN}$ of 1.5 mA the input circuit still does not detect the high state yet. This is required for a DC 24 V type 3 input according to the standard IEC 61131-2, provided that the input voltage is between 5 V and 11V.

In an alternative embodiment it is also possible, for example, to design the coupling element as a transistor stage. As a result, a digital input circuit in a non-electrically isolated embodiment is created.

It has been shown that the temperature influence of the input current can be minimized by a suitable embodiment of the first subcircuit and the second subcircuit. In a particularly advantageous embodiment it is proposed that the Zener diodes of the first and the second subcircuit have a negative temperature coefficient. If such Zener diodes are used that have a negative temperature coefficient, then they can be cancelled at least partially with the equally negative temperature coefficients of the base/emitter voltages of the transistors. In other words, the temperature dependent voltage variations of the Zener diodes and the base/emitter voltages of the transistors of the two subcircuits can compensate for each other relatively well.

The main advantages of the circuit architecture described above are, in particular,
- a simple and inexpensive implementation,
- its suitability for all types of digital input circuits 100 according to IEC 61131-2 (type 1, 2 and 3),
- its suitability for current drawing and current supplying digital input circuits 100,
- its suitability for digital input circuits 100 with and without electrical isolation, as well as
- its suitability for safety-oriented applications, in particular, in safety switching apparatuses for the fail-safe shutdown of a technical system, or in I/O modules.

The digital input circuit with the circuit architecture described above can be implemented, in particular, by discrete components. As an alternative, a digital input circuit with this circuit architecture can also be implemented by an integrated circuit in an IC, in particular, an ASIC.

The digital input circuit described herein does not have per se ultra low losses. How large the electrical power loss actually is depends ultimately on the dimensions of the circuit. Dimensions that minimize the power loss are possible (in particular, of course, in the high level region). It would be just as easy to select dimensions that result in greater or high power losses. In the case of a digital input circuit of the type 2, the standard IEC 61131-2 demands at a DC 24 V input in the high level region, for example, a minimum current of 6 mA and, in so doing, three times as much as for a digital input circuit of the type 1 or type 3 (at least 2 mA). Consequently in the case of a type 2 digital input circuit the power loss in the high level region is then at least three times as large as in the case of a type 1 or type 3 digital input circuit. Nevertheless, it goes without saying that even in the case of a type 2 digital input circuit the power loss can be kept at a minimum with the circuit architecture that is described herein.

BRIEF DESCRIPTION OF THE DRAWINGS

Other features and advantages of the present invention will become apparent from the following description of a preferred exemplary embodiment with reference to the accompanying drawings.

DETAILED DESCRIPTION

Figure 4:
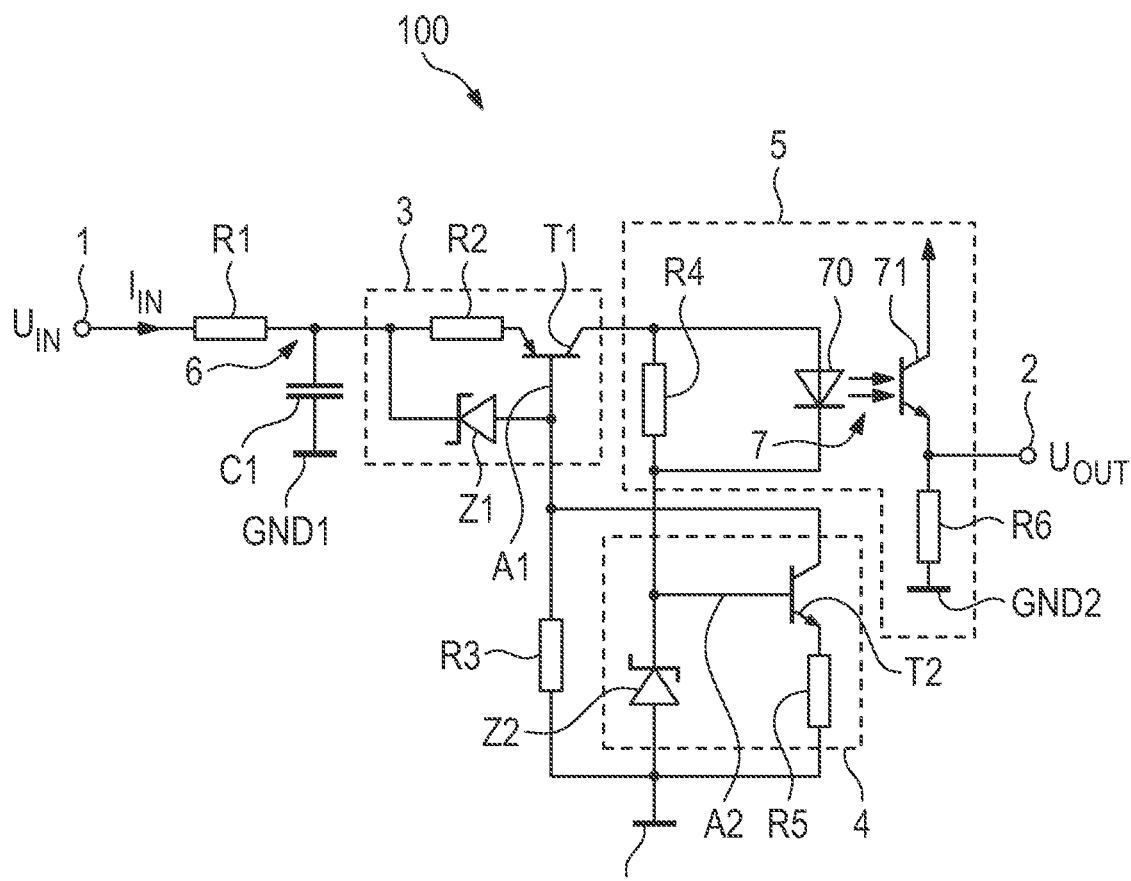
FIG. 4 is a digital input circuit that is designed according to a preferred exemplary embodiment of the present invention.

The configuration of a digital input circuit 100, which is designed according to a preferred exemplary embodiment of the present invention, shall be explained in greater detail below with reference to FIG. 4. The digital input circuit 100 comprises an input 1, by which the digital input circuit 100 can be connected to a signal generator. The signal generator, which can make a digital input signal available to the input circuit, can be, in particular, a sensor unit or an event signaling device, such as, for example, an emergency OFF button, an emergency STOP bottom, a safety door, a safety shutdown mat, a two hand switch, an end position switch or a position switch. The event signaling device can also operate, for example, contact free and can be designed, for example, as a light array or a light barrier or alternatively comprise them. These digital input signals, which are provided by the signal generator, are binary signals and are characterized by two defined states that may be given, in particular, by two static potentials. As already explained above, these two states are characterized by various voltage levels. In this case the states are a first state, in which the input voltage $U_{IN}$ drops below a defined threshold value and which is often also referred to as the low level state, as well as a second state, in which the input voltage $U_{IN}$ exceeds a defined threshold value and which is often also referred to as the high level state. The low level region is defined by an input voltage $U_{IN} \leq U_{Low,\,max}$ as well as by an input current $I_{IN} \leq I_{Low,\,max}$. The high level region is defined by an input voltage $U_{High,\,min} \leq U_{IN} \leq U_{High,\,max}$ and by an input current $I_{IN} \geq I_{High,\,min}$.

The circuit configuration of the digital input circuit 100 presented herein can be divided from a functional view roughly into three subcircuits 3, 4, 5, which shall be explained in greater detail below.

The digital input circuit 100 comprises an input filter 6, which is connected, on the one hand, to the input 1 and, on the other hand, also to the first subcircuit 3. The input filter 6 comprises a resistor R1 and a capacitor C1, which is connected downstream of the resistor. The capacitor has an electrode that is connected to ground GND1. The capacitor C1 is used, in particular, to smooth the input voltage $U_{IN}$ and, in addition, also to improve the electromagnetic compatibility of the digital input circuit 100. For example, the resistor R1 of the input filter 6 may have a resistance value of 1.5 k ohms.

The first subcircuit 3 comprises a first transistor T1, which forms a first current stabilizing element of the digital input circuit 100 and has a driving circuit A1, as well as a first Zener diode Z1, which forms a first voltage stabilizing element of the digital input circuit 100. In the exemplary embodiment shown herein, the first transistor T1 is designed as a PNP transistor. Furthermore, the first subcircuit 3 comprises a resistor R2, which is provided between an emitter of the first (PNP) transistor T1 and the input filter 6 and, as a result, is connected to the input 1 of the digital input circuit 100. For example, the resistor R2 may have a resistance value of 1.1 k ohms. This first subcircuit 3 exhibits a non-ideal current output behavior. Consequently it does not supply a constant output current (at least) in the second state (high level state), but rather an output current, which continues to rise when the input voltage $U_{IN}$ increases, and, thus, also results in an increase in the input current $I_{IN}$.

The second subcircuit 4 comprises a second transistor T2, which forms a second current stabilizing element of the digital input circuit 100 and has a driving circuit A2, as well as a second Zener diode Z2, which forms a second voltage stabilizing element of the digital input circuit 100. In the exemplary embodiment shown herein, the second transistor T2 is designed as an NPN transistor. Furthermore, the second subcircuit 4 comprises a resistor R5, which connects an emitter of the second (NPN) transistor T1 to ground GND1. For example, the resistor R5 may have a resistance value of 1.1 k ohms, so that it is dimensioned in a manner analogous to the resistor R2 of the first subcircuit 3. The second subcircuit 4 also exhibits a non-ideal current output behavior. Consequently it, too, does not supply a constant output current (at least) in the second state (high level state), but rather an output current, which continues to rise when the input voltage $U_{IN}$ increases, and, thus, also results in an increase in the input current $I_{IN}$.

Furthermore, the digital input circuit 100 comprises a high valued resistor R3, by which the first subcircuit 3 is connected to ground GND1; and the resistance value of the resistor is preferably ≥1 mega ohm. In the present exemplary embodiment this high valued resistor R3, which connects the first subcircuit 3 to ground GND1, has to ensure the function that when the input voltage $U_{IN}$ increases (starting from 0 V), an electric current is able to flow at all into the input circuit 100. Thus, the resistor R3 is used to some extent as an "initial resistor" or, more specifically, a "starting resistor." Specifically this resistor R3 enables in this "power-up phase" that a current is able to flow at all in the driving circuit A1 of the first transistor T1. This current in turn is a prerequisite for the first subcircuit 3 to be able to supply a current (over the collector of the first transistor T1). This current in turn is the prerequisite for a current flow in the driving circuit A2 of the second transistor T2 that ultimately enables a current flow into the second subcircuit 4 (over the collector/emitter path of the second transistor T2). Consequently the resistor R3 is necessary for a reliable operation of the digital input circuit 100 of the exemplary embodiment according to FIG. 4. Although under some circumstances the leakage currents may ensure that in the "power-up phase" described above a current flow in the driving circuit A1 of the first transistor T1 will take place even without a resistor R3, it is generally not reliable and, thus, impractical.

In the present embodiment the third subcircuit 5 is configured to determine the logic state of the input signal, which is fed through the input 1 to the digital input circuit 100, and, thus, to determine also the logic state of the digital input circuit 100. The third subcircuit 5 of the input circuit 100 is connected to an output 2, through which an output voltage $U_{OUT}$ can be emitted. This third subcircuit 5 comprises a first resistor R4, which is connected to the collector of the first transistor T1, as well as a second resistor R6. The second resistor R6 comprises a first port, which is connected to the output 2, as well as a second port, which is connected to ground GND2. Furthermore, the third subcircuit 5 comprises a coupling element 7, in order to separate the first subcircuit 3, the second subcircuit 4 and the resistor R4 of the third subcircuit 5 from the resistor R6 and the output 2. In the exemplary embodiment shown herein, this coupling element 7 is configured to cause a complete galvanic separation (i.e., an electrical isolation) of the first subcircuit 3, the second subcircuit 4 and the first resistor R4 of the third subcircuit 5, on the one hand, from the second resistor R6 of the third subcircuit 5 and the output 2, on the other hand. Thus, the first subcircuit 3, the second subcircuit 4 and the first resistor R4 of the third subcircuit 5 are formed on a primary side of the digital input circuit 100, whereas the output 2 and the second resistor R6 are provided on a secondary side of the digital input circuit 100.

In the exemplary embodiment shown herein, the coupling element 7, which enables a signal transmission from the primary side to the secondary side, is designed as an optocoupler, which comprises a light emitting diode 70 on the primary side and a phototransistor 71 on the secondary side. The phototransistor 71 comprises in the conventional manner an emitter that is connected to ground GND2 by way of the resistor R6 and, in addition, is also connected to the output 2 of the digital input circuit 100.

In this case the first resistor R4 of the third subcircuit 5 provides, on the one hand, the necessary switching threshold of the coupling element 7, which is designed as an optocoupler in the present embodiment, and which limits, on the other hand, the current through the light emitting diode 70 of the optocoupler (in the high level region) to the value, for which the optocoupler is designed (for example, to a current of 1 mA). Finally the current that flows through the resistor R4 also serves the purpose that at an input current $I_{IN}$ of 1.5 mA the digital input circuit 100 still does not detect the high level state. This is required for a DC 24 V type 3 input according to the standard IEC 61131-2, provided that the input voltage is between 5 V and 11V.

The detection of whether the input voltage $U_{IN}$ is in the low level region (first state of the digital input circuit 100) or in the high level region (second state of the digital input circuit 100) takes place by the coupling element 7 and the resistor R4, which is connected in parallel to the coupling element and which forms from a functional perspective a threshold value element. From a functional perspective the resistor R4 and the Zener diode Z2 of the second subcircuit 4 form together a voltage divider, wherein the Zener diode Z2 provides a voltage reference. The resistor R4 is dimensioned such that a current flows through the light emitting diode 70 of the coupling element 7, which is designed as an optocoupler in the present embodiment, only if for the input voltage $U_{IN}$ it holds: $U_{IN} \geq U_{High, \, min}$. For example, the resistor R4 may have a resistance value of 2 k ohms. The high level state has to be determined no later than at $U_{IN} = U_{High, \, min}$. Therefore, in order to guarantee this, in practice the high level state is already detected at $U_{IN} < U_{High, \, min}$ (thus, inside the transition region). Then the collector/emitter path of the phototransistor 71 become conductive, so that a corresponding output signal $U_{OUT}$ can be provided at the output 2, the output signal representing the second state (high level state). Otherwise, a corresponding output signal $U_{OUT}$, which represents the first state (low level state), is provided at the output 2.

This galvanic separation, explained above, has the advantage that in the event of an overvoltage the output 2 or, more specifically, the components connected to the output can be protected against damages as well as the resulting faults. In an alternative embodiment it is also possible, for example, to replace the coupling element 7, which is designed as an optocoupler in the present embodiment, with a transistor stage. As a result, a digital input circuit 100 in a non-electrically isolated embodiment is created.

The first and the second subcircuits 3, 4 form two current sources (the second subcircuit 4 could also be referred to as the current sink), which are designed in such a way and are connected to one another such that the non-ideal current output behavior of the first subcircuit 3 and the non-ideal current output behavior of the second subcircuit 4 largely compensate for each other at least partially in the second state (i.e., in the high level region or, more specifically, at least in a portion of the high level region). In this case the first subcircuit 3 and the second subcircuit 4 are connected in series crosswise. At the same time the base of the transistor T1 of the first subcircuit 3, which forms a portion of the driving circuit A1 of the transistor T1, is connected to the collector of the bipolar transistor T2 of the second subcircuit 4. In addition, the base of the bipolar transistor T2 of the second subcircuit 4, which forms a portion of the driving circuit A2 of the transistor T2, is connected via the resistor R4 to the collector of the bipolar transistor T1 of the first subcircuit 3.

During the operation of the digital input circuit 100 and the reception of input signals in the high level region or, more specifically, at least in a portion of the high level region, a current flows out of the first subcircuit 3 into the third subcircuit 5, by which the logic state of the input signal $U_{IN}$ can be determined. A compensation of the non-ideal current output behavior of the two subcircuits 3, 4 is achieved in that the current, which flows through the first Zener diode Z1, consists essentially of the stabilized current of the second subcircuit 4; and the current, which flows through the second Zener diode Z2, consists essentially of the stabilized current of the first subcircuit 3. The good mutual stabilization of the currents of the two subcircuits 3, 4 and, thus, the entire input current of the input circuit 100 is based in this circuit architecture on the fact that the currents of the Zener diodes Z1, Z2 and, as a result thereof, also the voltages of the Zener diodes Z1, Z2 are kept stable. The mutual stabilization of the currents of the two subcircuits 3, 4 is greatest, when the Zener diodes Z1, Z2 are in their respective stabilization region. The currents of the two driving circuits A1, A2 make up only a small portion of the currents of the two subcircuits 3, 4 in the second state (high level region). The transistor T2 of the second subcircuit 4 can control a base current $I_{B,T1}$ of the transistor T1 of the first subcircuit 3 in the low level region. Inversely the transistor T1 of the first subcircuit 3 can control a base current $I_{B,T2}$ of the transistor T2 of the second subcircuit 4 in the low level region. In the high level region the transistors T1, T2 control primarily the currents through the Zener diodes Z1, Z2 of the respective other subcircuit 3, 4.

Figure 1:
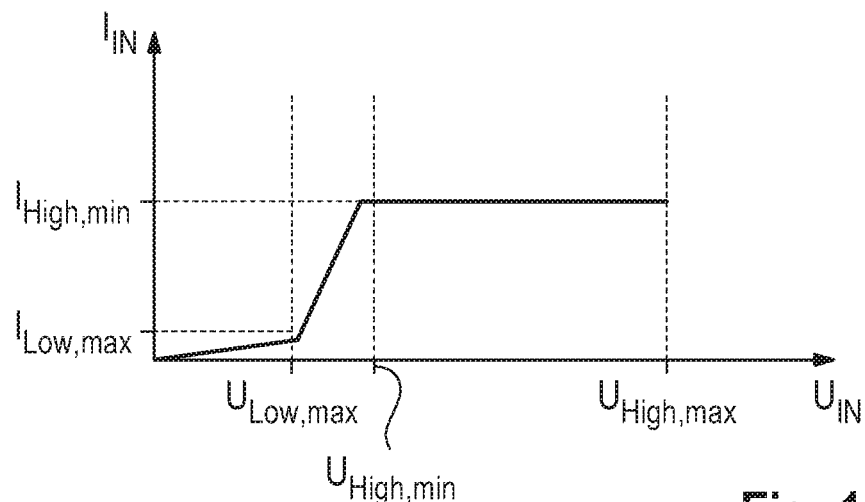
FIG. 1 is an idealized shape of an input current/input voltage characteristic of a digital input circuit.
Figure 2:
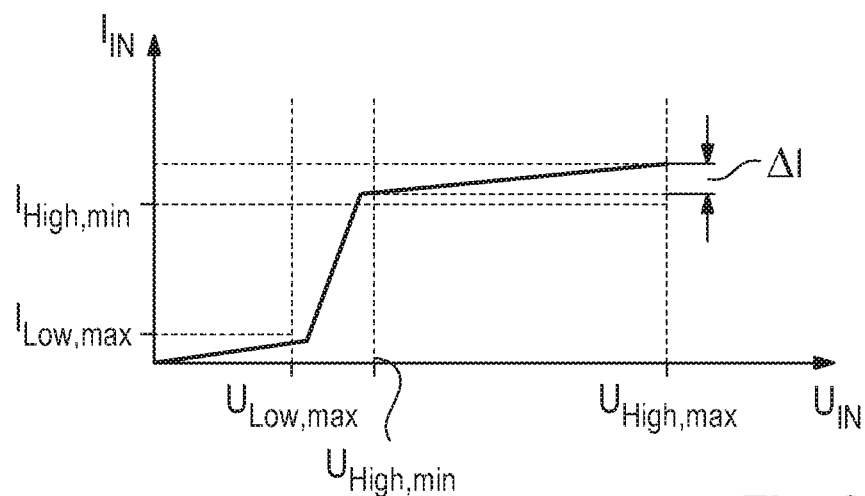
FIG. 2 is an actual shape of an input current/input voltage characteristic of a digital input circuit.

In the logic high level region, which is characterized by the second state of the digital input circuit 100, the Zener diode Z1 of the first subcircuit 3 and the Zener diode Z2 of the second subcircuit 4 are operated in their respective stabilization region. Accordingly, the current of the first subcircuit 3 in this state flows substantially through the Zener diode Z2 of the second subcircuit 4. In this state the electric current through the Zener diode Z1 of the first subcircuit 3 flows almost completely into the second subcircuit 4, provided that the resistor R3 is selected adequately large. For example, the resistor R3 can have a resistance value of 1 mega ohm. However, the currents of both subcircuits 3, 4 also flow already almost completely through the Zener diodes Z1, Z2 of the respective other subcircuit 3, 4 before the two Zener diodes Z1, Z2 are operated in their respective stabilization region, in particular, in the transition of the Zener diodes Z1, Z2 from the blocking region into the conducting region. Owing to the crosswise series connection of the first subcircuit 3 and the second subcircuit 4, the essentially constant currents of the respective other subcircuit 3, 4 flow through both Zener diodes Z12, Z2 of the first and second subcircuit 3, 4 at least in the case of the input signals $U_{IN}$ in the high level region (second state of the digital input circuit 100). Thus, on the whole the entire input current $I_{IN}$ remains essentially constant. Owing to this measure it is possible to minimize the current rise $\Delta I$ in the high level region, so that an input current/input voltage characteristic curve of the digital input circuit 100 that corresponds virtually to the ideal characteristic curve according to FIG. 1 can be obtained. Due to a minimization of the current rise $\Delta I$ in the high level region, which with the circuit architecture described herein edges preferably towards zero, the power loss of the digital input circuit 100 can be minimized in an advantageous way.

Figure 3:
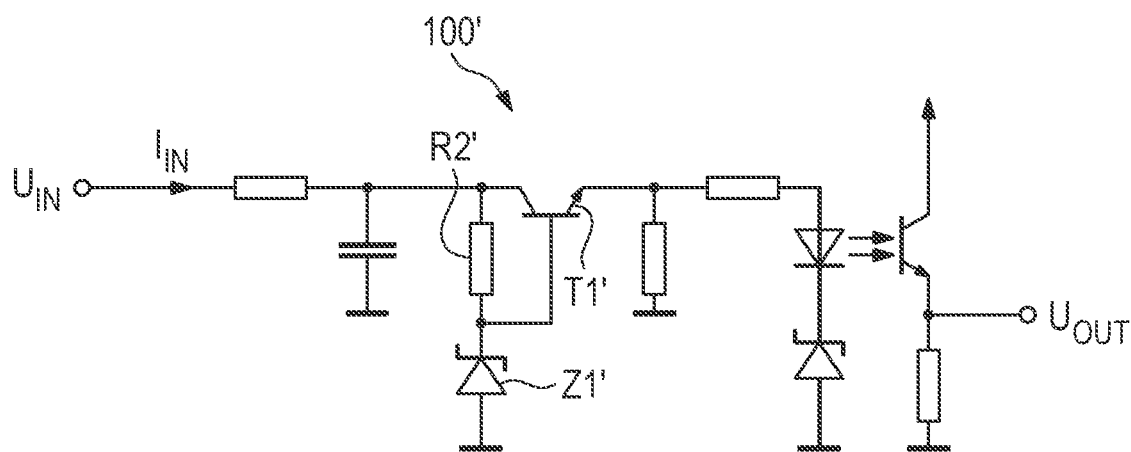
FIG. 3 is a digital input circuit according to the prior art.

One essential advantage of the circuit architecture described herein is that it is possible to select the dimensions of the Zener diodes in a very simple way when Zener diodes Z1, Z2 are used for the first subcircuit 3 and for the second subcircuit 4, so that at least for the input signals $U_{IN}$ in the high level region an adequately large current flows through both Zener diodes Z1, Z2, in order to be able to operate them in their stabilization region or at least close to it. This is achieved without a disadvantageous, notable increase in the input current $I_{IN}$ in the high level region, which would be the case with the digital input circuit 100', according to FIG. 3, and an operation of the Zener diode Z1' of the voltage regulator, provided therein, in the stabilization region.

Another advantage of operating the Zener diodes Z1, Z2 of the first subcircuit 3 and the second subcircuit 4 in their stabilization region is the fact that, as a result, their influence on the component dependent tolerance of the currents of the first subcircuit 3 and the second subcircuit 4 is also the lowest. Thus, the current rise $\Delta I$ is minimal, when the Zener diodes Z1, Z2 of the two subcircuits 3, 4 are operated in their respective stabilization region, and the series resistor R3 of the Zener diode Z1 of the first subcircuit 3 is selected as large as possible (for example, as already stated above, R3=1 mega ohm or higher). The two Zener diodes Z1, Z2 may have, for example, a breakdown voltage of 2.7 V.

The temperature influence of the input current $I_{IN}$ can be minimized by a suitable embodiment of the first subcircuit 3 and the second subcircuit 4. For example, for this purpose it is possible to use Zener diodes Z1, Z2 that have a negative temperature coefficient, so that they can be cancelled at least partially with the equally negative temperature coefficients of the base/emitter voltages of the transistors T1, T2. In other word, the temperature dependent voltage variations of the Zener diodes Z1, Z2 and the base/emitter voltages of the transistors T1, T2 of the first and second subcircuits 3, 4 can compensate for each other relatively well.

As an alternative, it is also possible to obtain a compensation of the temperature coefficients of the base/emitter voltages of the transistors T1, T2 by adding one conventional diode each in series to the Zener diode Z1 of the first subcircuit 3 and to the Zener diode Z2 of the second subcircuit 4.

The advantages of the circuit architecture described herein are, in particular,

- a simple and inexpensive implementation,
- its suitability for all types of digital input circuits 100 according to IEC 61131-2 (type 1, 2 and 3),
- its suitability for current drawing and current supplying digital input circuits 100,
- its suitability for digital input circuits 100 with and without electrical isolation, as well as
- its suitability for safety-oriented applications, in particular, in safety switching apparatuses for the fail-safe shutdown of a technical system, or in I/O modules.

A digital input circuit 100 was described above that was implemented by discrete components. As an alternative, a digital input circuit 100 with this circuit architecture can also be implemented by an integrated circuit in an IC, in particular, an ASIC.

In another embodiment it is also possible to house the third subcircuit 5, which is provided for the detection of the logic state of the input signal $U_{IN}$, offset in a separate device unit.

What is claimed is:

1. A digital input circuit for receiving digital input signals of a signal generator, the digital input circuit comprising:
   an input to receive an input signal, wherein the digital input circuit adopts a first state in response to the input signal reaching or dropping below a lower threshold value and adopts a second state in response to the input signal reaching or exceeding an upper threshold value;
   a first subcircuit comprising at least one current stabilizing element with a driving circuit and at least one voltage stabilizing element, wherein the first subcircuit exhibits a non-ideal current output behavior at least in the second state; and
   a second subcircuit comprising at least one current stabilizing element with a driving circuit and at least one voltage stabilizing element, wherein the second subcircuit exhibits a non-ideal current output behavior at least in the second state; and
   a high-valued resistor connected between the first subcircuit and ground, the high-valued resistor having a resistance value greater than 750 k ohms, wherein the high-valued resistor is directly connected to the ground, wherein the first and second subcircuits are configured such that at least in the second state or at least in a portion of the second state, an electric current that flows through the voltage stabilizing element of the first subcircuit consists substantially of a stabilized current of the second subcircuit, and an electric current that flows through the voltage stabilizing element of the second subcircuit consists substantially of a stabilized current of the first subcircuit, such that the non-ideal current output behavior of the first subcircuit and the non-ideal current output behavior of the second subcircuit substantially compensate for each other at least in the second state.

2. The digital input circuit of claim 1, wherein the voltage stabilizing elements of the first and second subcircuits respectively comprise first and second Zener diodes that are operated in their stabilization region in the second state.

3. The digital input circuit of claim 1, wherein the current stabilizing element of the first subcircuit comprises a PNP bipolar transistor having a base, an emitter, and a collector.

4. The digital input circuit of claim 3, wherein the current stabilizing element of the second subcircuit comprises an NPN bipolar transistor having a base, an emitter, and a collector.

5. The digital input circuit of claim 4, wherein the first and second subcircuits are connected to each other such that the base of the PNP bipolar transistor of the first subcircuit is connected to the collector of the NPN bipolar transistor of the second subcircuit.

6. The digital input circuit of claim 4, wherein the first and second subcircuits are connected to each other such that the base of the NPN bipolar transistor of the second subcircuit is connected to the collector of the PNP bipolar transistor of the first subcircuit.

7. The digital input circuit of claim 1, further comprising: an output through which an output signal can be emitted; and a third subcircuit connected to the output and configured to detect a logic state of the digital input circuit.

8. The digital input circuit of claim 7, wherein the third subcircuit comprises a coupling element configured to couple the input of the digital input circuit to the output of the digital input circuit, and a threshold value element connected in parallel to the coupling element, wherein the threshold value element comprises a resistor and is configured to make a switching threshold available to the coupling element.

9. The digital input circuit of claim 1, wherein the voltage stabilizing elements of the first and second subcircuits respectively comprise first and second Zener diodes that have a negative temperature coefficient.

10. The digital input circuit of claim 1, wherein the digital input circuit adopts the first state in response to the input signal reaching or dropping below approximately 10 Volts, wherein the 10 Volts is the lower threshold value.

* * * * *